(12) United States Patent
Kwon

(10) Patent No.: US 10,110,432 B2
(45) Date of Patent: Oct. 23, 2018

(54) TELECOMMUNICATIONS SYSTEM FOR PROGRAMMABLE LOGIC CONTROLLER

(71) Applicant: LSIS CO., LTD., Gyeonggi-do (KR)

(72) Inventor: Jae-Il Kwon, Gyeonggi-do (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 87 days.

(21) Appl. No.: 15/350,302

(22) Filed: Nov. 14, 2016

(65) Prior Publication Data

US 2017/0288964 A1  Oct. 5, 2017

(30) Foreign Application Priority Data

Apr. 5, 2016 (KR) .................. 10-2016-0041934

(51) Int. Cl.
*H04L 12/24* (2006.01)
*H04L 29/08* (2006.01)
(Continued)

(52) U.S. Cl.
CPC ........ *H04L 41/0806* (2013.01); *G05B 19/058* (2013.01); *H04L 1/20* (2013.01);
(Continued)

(58) Field of Classification Search
CPC ....... H04L 41/0806; H04L 67/10; H04L 1/20; G01R 19/1659; G05B 9/02;
(Continued)

(56) References Cited

U.S. PATENT DOCUMENTS 6,021,356 A * 2/2000 Chang .................. G05B 19/052
219/110
7,120,505 B2 * 10/2006 Nakamura ............... G05B 9/02
700/3

(Continued)

FOREIGN PATENT DOCUMENTS

DE 42 25 834 A1 2/1994
JP 04072937 A 3/1992

(Continued)

OTHER PUBLICATIONS

Search Report dated Aug. 9, 2017 issued in corresponding European Application No. 16193033.4.

(Continued)

*Primary Examiner* — Man U Phan
(74) *Attorney, Agent, or Firm* — K&L Gates LLP

(57) ABSTRACT

A telecommunications system for a programmable logic controller (PLC) includes: a master module comprising a transmitter and a receiver; one or more slave modules configured to receive signals transmitted from the transmitter and transmit signals to the receiver in response to the transmitted signals; a signal conversion module configured to convert the signals transmitted between the master module and the slave modules into digital signals; a control module configured to control the signal conversion module and to determine whether there is an error in the signals transmitted between the master module and the slave modules based on the digital signals; a display module configured to display a result of the determination by the control module.

7 Claims, 9 Drawing Sheets

(51) Int. Cl.
    *G05B 19/05*     (2006.01)
    *H04L 1/20*     (2006.01)
    *G01R 19/165*     (2006.01)
    *G05B 9/02*     (2006.01)
    *G06F 11/00*     (2006.01)

(52) U.S. Cl.
    CPC .......... *H04L 67/10* (2013.01); *G01R 19/1659* (2013.01); *G05B 9/02* (2013.01); *G05B 19/052* (2013.01); *G05B 2219/15026* (2013.01); *G06F 11/00* (2013.01)

(58) Field of Classification Search
    CPC ........ G05B 2219/15026; G05B 19/058; G05B 19/052; G06F 11/00
    USPC ........................... 370/359–362; 709/208–211
    See application file for complete search history.

(56) References Cited

U.S. PATENT DOCUMENTS

| | | | | |
|---|---|---|---|---|
| 8,564,466 | B2* | 10/2013 | Hoshikawa | G06F 13/4072 |
| | | | | 341/141 |
| 9,798,611 | B2* | 10/2017 | Nakaminami | G05B 19/058 |
| 2005/0059363 | A1 | 3/2005 | Hansen | |
| 2010/0073206 | A1* | 3/2010 | Lee | H03M 1/1033 |
| | | | | 341/118 |
| 2012/0246612 | A1* | 9/2012 | Ji | G06F 11/3664 |
| | | | | 717/104 |
| 2013/0031426 | A1* | 1/2013 | Kan | G05B 19/058 |
| | | | | 714/48 |
| 2015/0039103 | A1* | 2/2015 | Liu | G06F 3/0488 |
| | | | | 700/83 |
| 2016/0011578 | A1* | 1/2016 | Tobori | G06F 11/22 |
| | | | | 700/79 |

FOREIGN PATENT DOCUMENTS

| | | |
|---|---|---|
| JP | 04142139 A | 5/1992 |
| JP | 2001-237842 A | 8/2001 |
| JP | 2006-148708 A | 6/2006 |
| JP | 2007300527 A | 11/2007 |
| JP | 09074427 A | 4/2008 |
| JP | 2008085397 A | 4/2008 |
| JP | 2010-245589 A | 10/2010 |
| JP | 2011-206948 A | 10/2011 |
| KR | 10-2014-0141938 A | 12/2014 |
| WO | 2006/011578 A1 | 2/2006 |
| WO | 2006011578 A1 | 2/2006 |
| WO | 2008038388 A1 | 4/2008 |
| WO | 2012120686 A1 | 9/2012 |

OTHER PUBLICATIONS

Japanese Office Action dated Jan. 9, 2018 issued in related JP Application No. 2016-226346; (4 Pages).

* cited by examiner (5) LARGE TERMINATING RESISTOR

TELECOMMUNICATIONS SYSTEM FOR PROGRAMMABLE LOGIC CONTROLLER

CROSS REFERENCE TO RELATED APPLICATION

This application claims the benefit of Korean Patent Application No. 10-2016-0041934, filed on Apr. 5, 2016, entitled "TELECOMMUNICATIONS SYSTEM FOR PROGRAMMABLE LOGIC CONTROLLER", which is hereby incorporated by reference in its entirety into this application.

BACKGROUND

1. Technical Field

The present disclosure relates to a telecommunications system employed in a programmable logic controller (PLC) or the like.

2. Description of the Related Art

A programmable logic controller (PLC) is an electronic controller for automatically controlling a various types of devices and installations in the industrial site. A PLC allows for a variety of systems by combining a CPU, communications function, special function, input/output function. In addition, as the control logic can be configured with a PLC program, there are advantages such as fast and easy design and change of the control system.

In existing communications method applied in an internal communications module of a PLC, if there is an error caused by numerous causes including a fault in a terminating resistor and short-circuit, or if noise is introduced into a transmission line to cause disturbance, it is difficult to exactly find out which one of the causes resulted in the error.

As a result, in order to find out the cause of the error in the communications, every master module and slave module of the communications module and the transmission line have to be checked, thus causing inconvenience.

SUMMARY

It is an aspect of the present disclosure to provide a telecommunications system disposed in a programmable logic controller (PLC) that detects if there is an error in transmitted signals in real-time to thereby automatically determine whether each individual element of the telecommunications system is normally operating.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a telecommunications system for a PLC includes: a master module comprising a transmitter and a receiver; one or more slave modules configured to receive signals transmitted from the transmitter and transmit signals to the receiver in response to the transmitted signals; a signal conversion module configured to convert the signals transmitted between the master module and the slave modules into digital signals; and a control module configured to control the signal conversion module and to determine whether there is an error in the signals transmitted between the master module and the slave modules based on the digital signals converted by the signal conversion module.

The control module may determine that the error is resulted from a noise fault if a maximum value of the digital signal is above a high-value voltage value and a minimum value of the digital signal is below a low-level voltage value.

The control module may determine that the error is resulted from a fault in a communications line if a maximum value of the digital signal is below a high-value voltage value and a minimum value of the digital signal is above a low-level voltage value.

The control module may determine that the error is resulted from a fault in a terminating resistor if there is a distortion waveform in the digital signal.

The telecommunications system may further include: a display module configured to display a result of the determination by the control module.

The display module may display a type of the error in the transmitted signal as at least one of a noise fault, a fault in the communications line and a fault in a terminating line as determined by the control module.

According to an exemplary embodiment of the present disclosure, a telecommunications system for a PLC can find out numerous causes of a communications error in real-time, thereby allowing for quick reaction for a failure. As a result, the system stability can be improved.

That is, when a fault in a terminating resistor on a communications line, a noise fault or a fault in each of communications modules takes place, it is possible to automatically detect where it has taken place and the cause in real-time.

Moreover, the master/slave system, the operating program, the parameter configuration used in typical telecommunications schemes for a PLC can be employed, thereby saving the cost for implementing the system.

DETAILED DESCRIPTION

Figure 1:
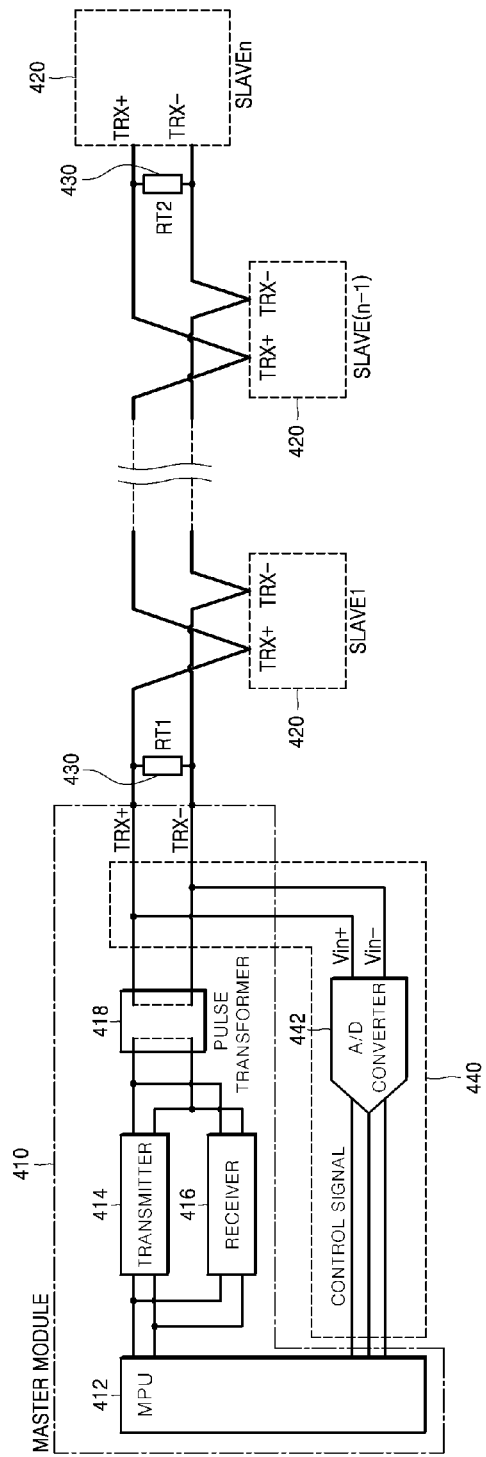
FIG. 1 is a block diagram of a telecommunications system for a PLC according to an exemplary embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed disclosures of well known functions or configurations may be omitted in order not to unnecessarily obscure the gist of the present disclosure.

Hereinafter, embodiments of the present disclosure will be described in detail with reference to the accompanying drawings. Throughout the drawings, like reference numerals refer to like elements.

Figure 2:
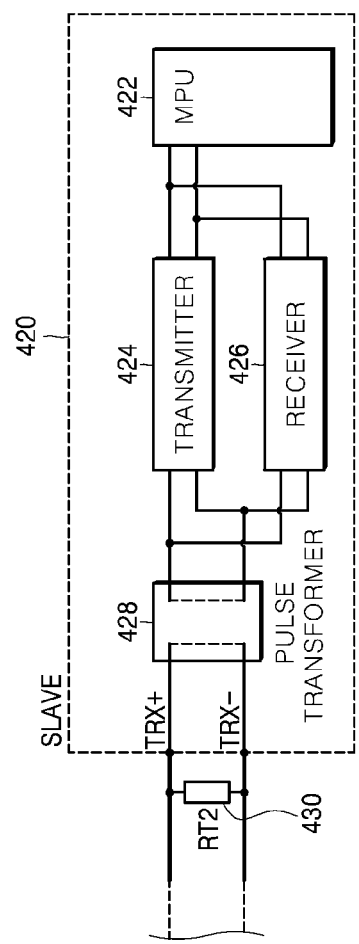
FIG. 2 is a block diagram of one of the slave modules shown in FIG. 1.

FIG. 1 is a block diagram of a telecommunications system for a PLC according to an exemplary embodiment of the present disclosure. FIG. 2 is a block diagram of one of the slave modules shown in FIG. 1.

As shown in FIG. 1, the telecommunications system for a PLC according to the exemplary embodiment of the present disclosure includes a master module 410, one or more slave modules 420, and a signal conversion module 440.

The master module 410 includes a MPU 412, a transmitter 414, a receiver 416 and a pulse transformer 418.

The MPU 412 performs the function of processing sequences associated with internal communications in a PLC, the function of controlling the transmitter 414 and the receiver 416, and the function of processing signals transmitted/received by the transmitter 414/the receiver 416.

The transmitter 414 transmits signals to the slave modules 420 under the control of the MPU 412.

The receiver 416 receives signals from the slave modules 420.

Specifically, when the transmitter 414 outputs data under the control of the MPU 412, the pulse transformer 418 isolates data input from the transmitter 414 and outputs a TRX+ signal and a TRX− signal via a transmission line. Terminating resistors 430 are connected to opposite ends of the transmission line.

Upon receiving signals from the pulse transformer 418 of the master module 410 via the transmission line, the slave modules 420 output acknowledgement signals in response to the TRX+ signal and the TRX− signal transmitted from the master module 410. The acknowledgement signal from the slave module 420 is transmitted to the pulse transformer 418 of the master module 410 via the transmission line. The pulse transformer 418 transmits the acknowledgement signal to the receiver 416.

As shown in FIG. 2, each of the slave modules 420 includes a slave MPU 422, a slave transmitter 424, a slave receiver 426, and a slave pulse transformer 428.

The slave MPU 422 performs the function of processing internal sequences and the function of controlling the slave transmitter 424 and the slave receiver 426.

The slave receiver 426 receives signals from the master module 410.

The slave transmitter 424 transmits an acknowledgement signal in response to a signal from the master module 410 to the master module 410 under the control of the slave MPU 422.

The slave pulse transformer 428 isolates the signal transmitted from the master module 410 via the transmission line and transmits it to the slave receiver 426.

The slave receiver 426 transmits the signal from the master module 410 to the slave MPU 422.

The slave MPU 422 transmits acknowledgement signals to the slave transmitter 424 in response to the signal from the master module 410, which has been subjected to internal sequences.

The slave transmitter 424 delivers the acknowledgement signal to the slave pulse transformer 428.

The slave pulse transformer 428 transmits the acknowledgement signal to the master module 410 via the transmission line.

Description will be made referring back to FIG. 1.

As described above, the telecommunications system for a PLC according to the exemplary embodiment of the present disclosure includes the single master module 410, and n slave modules 420 connected thereto.

In other words, the master module 410 may communicate with the slave modules 420 disposed in the first to nth stations, respectively. For example, the telecommunications system may include up to sixty-four stations including the master module and the slave modules and may have the maximum communications coverage of 750 m.

The terminating resistors 430 are disposed to match mutual impedance between the transmitting side and the receiving side of the transmission line. As shown in the drawings, the terminating resistors 430 may be disposed at the side of the master module (RT1) and the side of the last slave module (RT2), respectively.

The signal conversion module 440 includes an A/D converter 442 that converts a signal on the transmission line into a digital signal. The signal conversion module 440 transmits a digital signal to a control module (not shown).

The control module may detect if there is an error in the telecommunications system based on the digital signal delivered from the signal conversion module 440.

The control module may be implemented as the MPU 412 of the master module 410. By doing so, the space of the system can be utilized more efficiently and the cost can be saved.

Alternatively, the control module may be implemented as a separated device, although not shown in the drawings.

The telecommunications system according to the exemplary embodiment of the present disclosure may be applied to a RNET communications scheme that is an internal communications protocol for a PLC. However, this is merely illustrative. It will be understood that the telecommunications system may also be applied to other communications schemes than the RNET communications scheme.

Hereinafter, operating processes of the telecommunications system for a PLC according to an exemplary embodiment of the present disclosure will be described.

When the master module 410 transmits data, the transmitter 414 outputs predetermined data.

The pulse transformer 418 isolates data input from the transmitter 414 and outputs a TRX+ signal and a TRX− signal via the transmission line with the terminating resistors 430 connected to its opposite ends, respectively.

The slave modules 420 receive the TRX+ signal and the TRX− signal from the master module 410 via the transmission line. Then, the slave modules 420 transmit acknowledgement signals in response to the received TRX+ signal and TRX− signal to the master module 410.

In doing so, the signal conversion module 440 uses the A/D converter 442 to convert the signals transmitted/received to/from the master module 410. Then, the signal conversion module 440 transmits the converted digital signals to the control module. The control module may be implemented as either an additional device or as the MPU 412 of the master module 410.

The control module controls the A/D converter 442 of the signal conversion module 440. The control module may detect if there is an error in the telecommunications system and, if any, where the error is located based on the digital signal delivered from the signal conversion module 440.

That is, the control module may detect which of a noise fault, a fault in the communications line and a fault in the terminating resistors 430 has resulted the error in the telecommunications system based on the digital signal.

Referring to FIGS. 4 to 9, if the maximum value of the digital signal is above the high-level voltage value and the minimum value of the digital signal is below the low-level voltage value, the control module can determine that the error in the telecommunications system is a noise fault.

Alternatively, if the maximum value of the digital signal is below the high-level voltage value and the minimum value of the digital signal is above the low-level voltage value, the control module can determine that the cause of the error in the telecommunications system is a fault in the communications line.

Alternatively, if there is a distorted waveform in the digital signal, the control module can determine that the cause of the error in the telecommunications system is a fault in the terminating resistors 430.

In addition, the telecommunications system according to an exemplary embodiment of the present disclosure may further include a display module (not shown) for displaying information on an error in the system and the location of the error determined by the control module.

In this case, the waveform of the digital signal converted by the signal conversion module 440 may be displayed on the display module. As a result, it makes easier for the user such as a manager to analyze by herself/himself whether there is an error in the telecommunications system or where the error is.

Moreover, the telecommunications system for a PLC according to an exemplary embodiment of the present disclosure may further include an analysis module (not shown) that helps users such as a manager analyze information on the waveform of the digital signal by analyzing the waveform of the digital signal and providing analysis information thereon. For example, the analysis module, like the control module, may be implemented as the MPU 412 of the master module 410.

Figure 3:
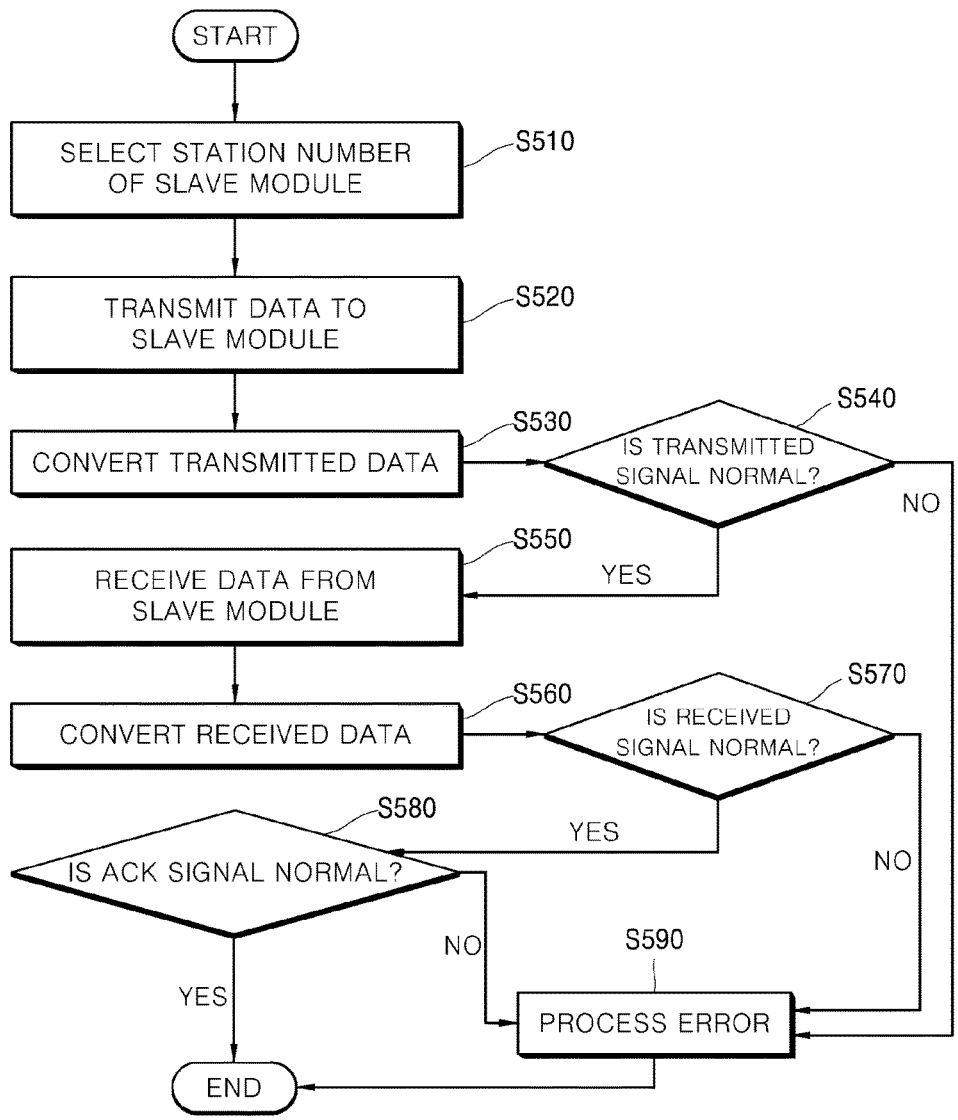
FIG. 3 is a flow chart for illustrating a communications method in a PLC system according to an exemplary embodiment of the present disclosure.

FIG. 3 is a flow chart for illustrating a communications method in a PLC system according to an exemplary embodiment of the present disclosure.

Figure 4:
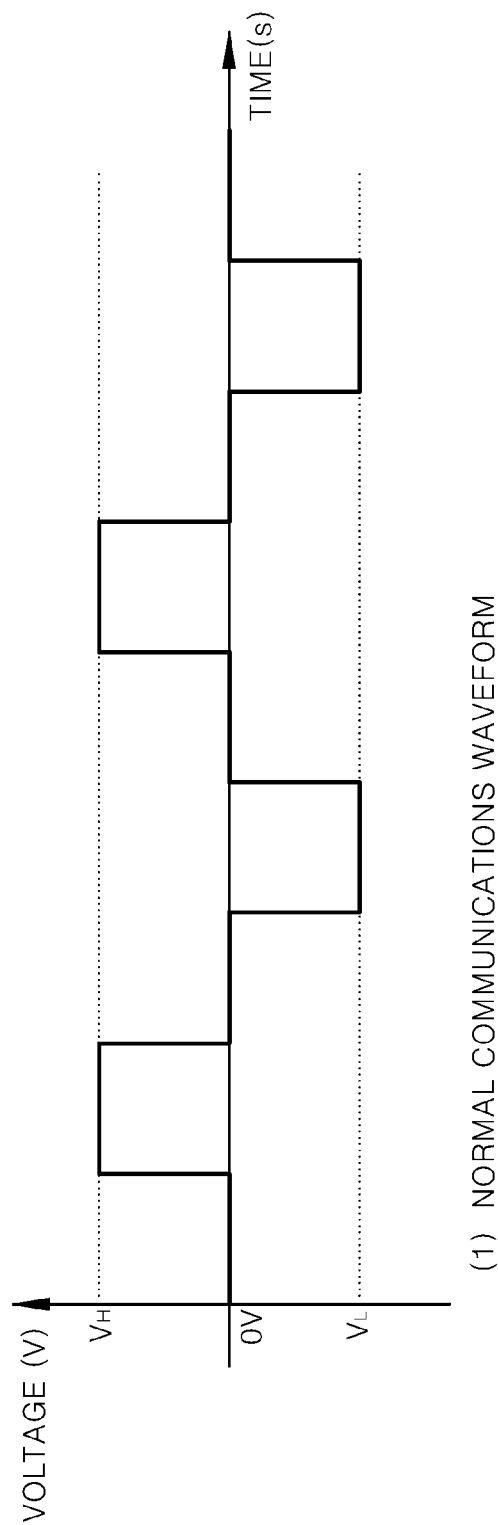
FIG. 4 is a graph showing an example of a normal communications waveform.
Figure 5:
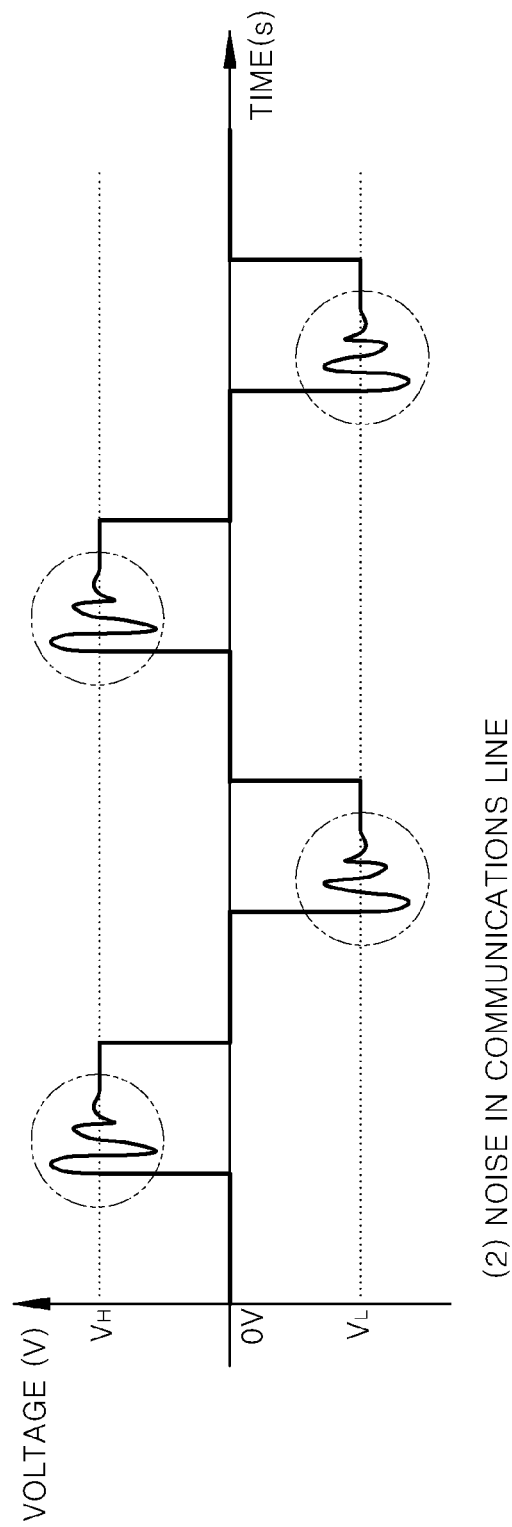
FIG. 5 is a graph showing an example of a signal waveform when noise is introduced on a communications line.
Figure 6:
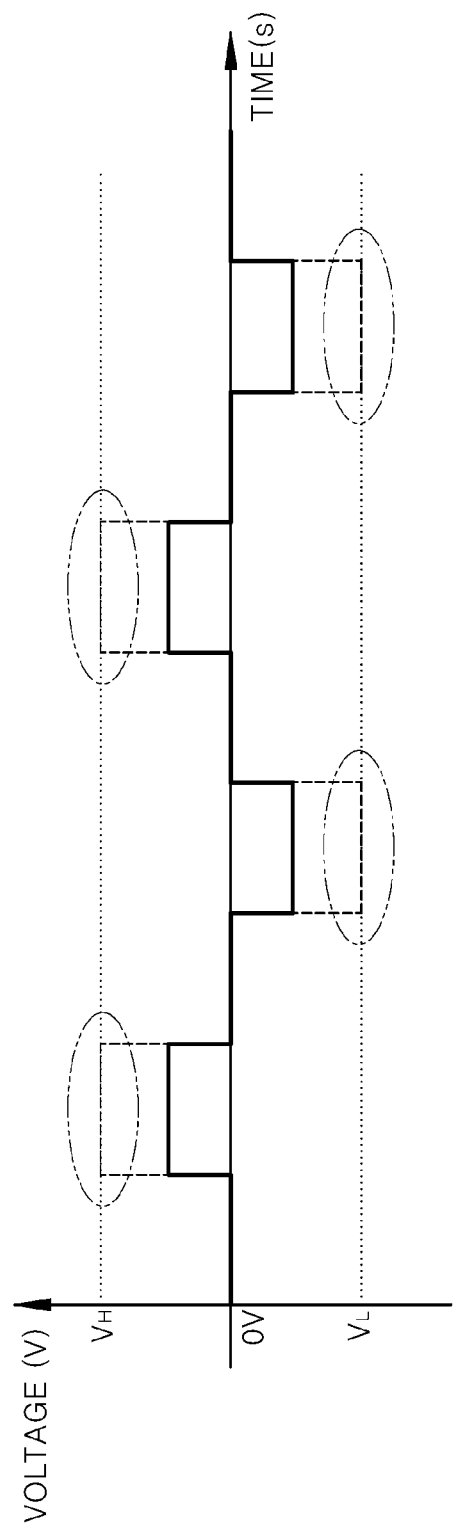
FIG. 6 is a graph showing an example of a signal waveform when a fault takes place on a communications line.
Figure 7:
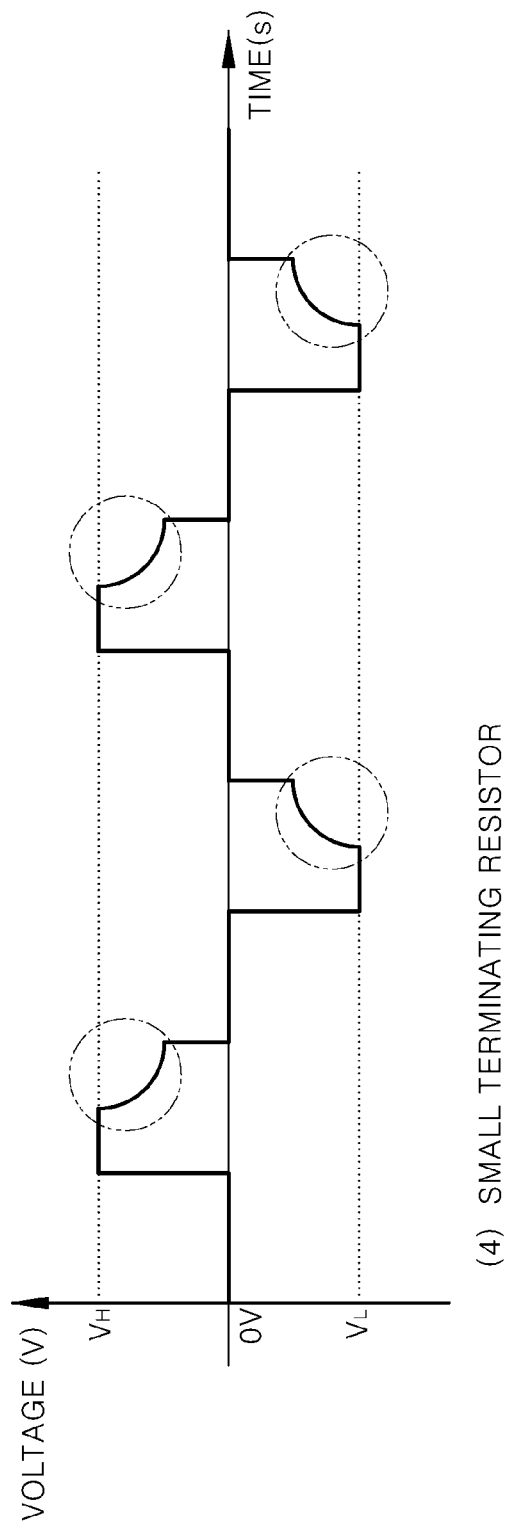
FIG. 7 is a graph showing an example of a signal waveform when the resistance of the terminating resistors are too small.
Figure 8:
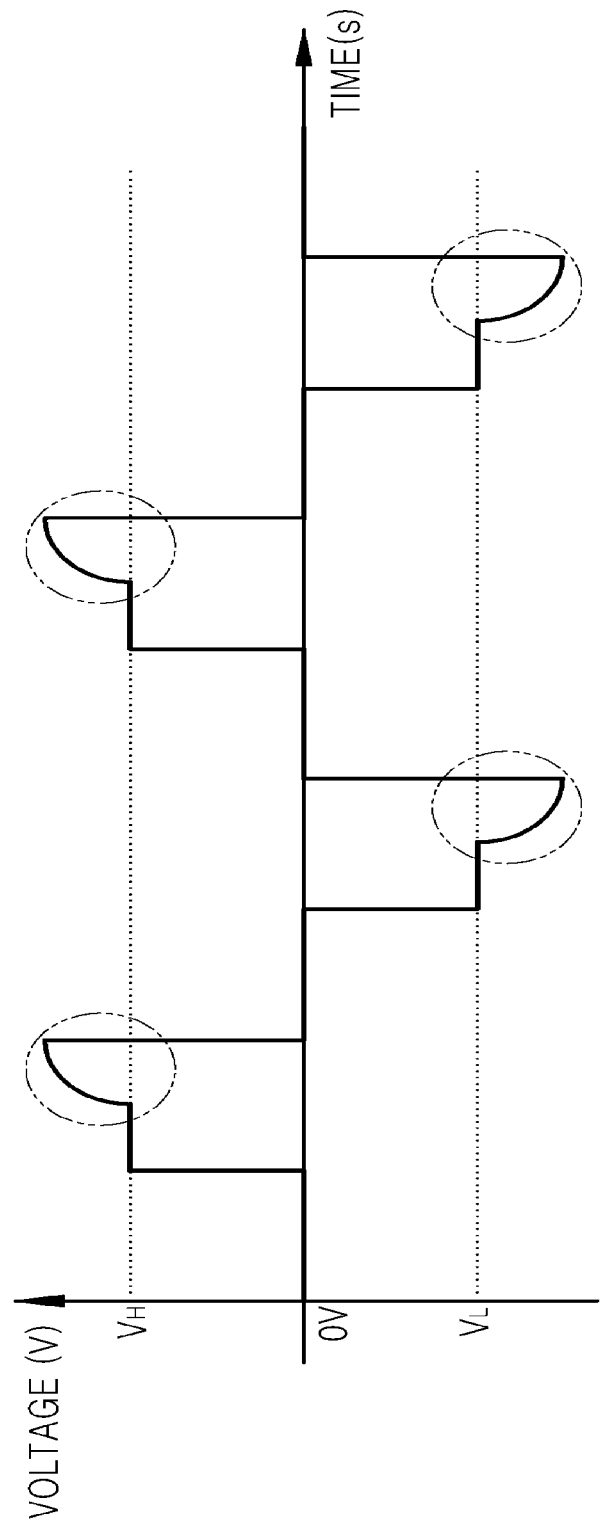
FIG. 8 is a graph showing an example of a signal waveform when the resistance of the terminating resistors are too large.
Figure 9:
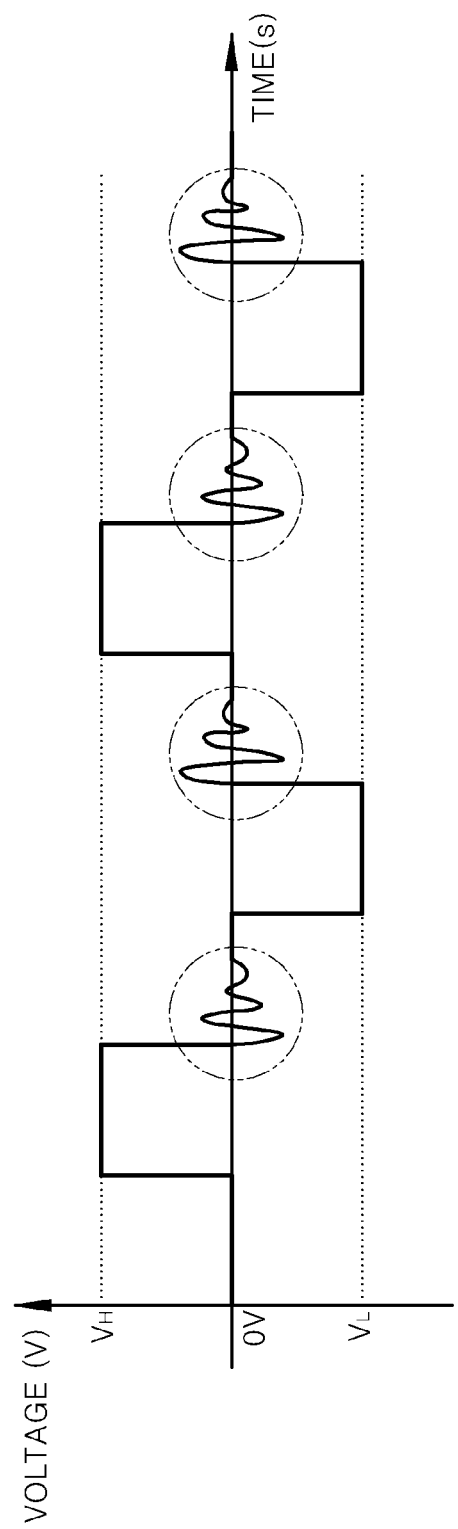
FIG. 9 is a graph showing an example of a signal waveform when no terminating resistor is disposed.

FIG. 4 is a graph showing an example of a normal communications waveform. FIG. 5 is a graph showing an example of a signal waveform when noise is introduced on a communications line. FIG. 6 is a graph showing an example of a signal waveform when a fault takes place on a communications line. FIG. 7 is a graph showing an example of a signal waveform when the resistance of the terminating resistors are too small. FIG. 8 is a graph showing an example of a signal waveform when the resistance of the terminating resistors are too large. FIG. 9 is a graph showing an example of a signal waveform when no terminating resistor is disposed.

As shown in FIG. 3, the communications method according to an exemplary embodiment of the present disclosure includes; selecting the station number of a slave module (step S510); transmitting data to the selected slave module (step S520); converting the transmitted data (step S530) to determine whether the transmitted data is normal (step S540); receiving data from the slave module (step S550); converting the received data (step S560); determining whether the received signal is normal (step S570); and determining whether an acknowledgement signal is normal (step S580).

In addition, the communications method may further include: determining that an error has taken place (step S590) if it is determined that at least one signal is not normal as a result of steps S540, S570 and S580; and ending the communications.

That is, unlike the existing communications method by which it is determined whether there is an error in the telecommunications system for a PLC by simply determining whether an acknowledgement signal is normal or not, according to the communications method according to the exemplary embodiment of the present disclosure, the method further include converting the signal transmitted from the master module and the signals transmitted from the slave modules are converted into digital signals (steps S530 and S560) and determining whether there is an error in the telecommunications system based on the digital signals.

That is, the signal transmitted from the master module to the slave modules (step S520) are converted into digital signals via the A/D conversion (step S530), and it is determined whether the voltage of the converted digital signal lies within the normal range (step S540). In this manner, it can be determined whether the transmitted signal from the master module lies within the normal range.

In addition, the signals transmitted from the slave modules to the master module (step S550) are converted into digital signals via the A/D conversion (step S560), and it is determined whether the voltage of the converted digital signal lies within the normal range (step S570). In this manner, it can be determined whether the transmitted signals from the slave modules lie within the normal range.

FIGS. 5 to 9 show waveforms of converted signals depending on different faults resulted from different causes such as a noise fault, a fault in the communications line, a fault in the terminating resistors, etc.

According to an exemplary embodiment of the present disclosure, the control module may accumulate levels of digital signals corresponding to the signal transmitted from the master module, calculate the maximum level and the minimum level, and determine whether there is a fault in the master module based on it.

Similarly, the control module may accumulate levels of digital signals corresponding to the signal transmitted from each of the slave modules per station number, calculate the maximum level and the minimum level, and determine whether there is a fault in the slave modules based on it.

As set forth above, the telecommunications system for a PLC and the communications method according to the exemplary embodiments of the present disclosure, can find out the cause of the communications error in real-time, thereby improving the system stability. Moreover, the master/slave system, the operating program, the parameter configuration used in typical telecommunications schemes for a PLC can be employed, thereby saving the cost for implementing the system.

The signal waveforms shown in FIGS. 5 to 9 will be described.

The stationary wave shown in FIG. 4 (case 1) indicates a normal communications waveform. It can be seen that the communications waveform shows a square wave signal that meets high-level voltage VH and low-level voltage VL.

When noise is introduced into the communications line as shown in FIG. 5 (case 2), a noise waveform is generated that exceeds the VH and the VL. When a wrong communications line is selected or a fault takes place in the communications line of the station as shown in FIG. 6 (case 3), voltage drop takes place in the communications signal that fails to reach the VH and VL.

When the terminating resistors are disposed whose resistance is smaller (case 4) or larger (case 5) than the rated value, e.g., 110Ω, as shown in FIGS. 7 and 8, respectively, distortion is generated in the waveform.

When no terminating resistor is disposed as shown in FIG. 9 (case 6), reflected wave is generated.

Accordingly, the control module disposed in the telecommunications system or the user such as a manager can easily find out the cause of the error in the system and the location of the error by comparing the normal communications waveform with the actually measured waveform.

The exemplary embodiments of the present disclosure described above may be substituted, altered, and modified by those skilled in the art without departing from the scope and sprit of the present disclosure. Therefore, the present disclosure is not limited to the above-mentioned exemplary embodiments and the accompanying drawings.

What is claimed is:

1. A telecommunications system disposed in a programmable logic controller (PLC), comprising:
    a master device comprising a transmitter and a receiver;
    one or more slave devices, wherein the master device is connected to a communication line, the transmitter is configured to transmit a signal through the communication line to the one or more slave modules, and the receiver is configured to receive a response signal through the communication line from the one or more slave modules;
    a signal conversion device connected to the communication line and configured to convert the signal and the response signal transmitted or received between the master device and the one or more slave devices into digital signals; and
    a control device configured to control the master device and the signal conversion device and to determine whether there is an error in the signal and the response signal based on the digital signals transmitted from the signal conversion module,
    wherein the control device determines that the error is resulted from a fault in the communication line if a maximum value of the digital signals is below a high-value voltage value and a minimum value of the digital signals is above a low-level voltage value.

2. The telecommunications system of claim 1, wherein the control device determines that the error is resulted from a noise fault if the maximum value of the digital signals is above the high-value voltage value and the minimum value of the digital signals is below the low-level voltage value.

3. The telecommunications system of claim 1, wherein the control device determines that the error is resulted from a fault in a terminating resistor if there is a distortion waveform in the digital signals.

4. The telecommunications system of claim 1, further comprising:
    a display device configured to display a result of the determination by the control device.

5. The telecommunications system of claim 4, wherein the display device displays a type of the error in the transmitted signal as at least one of a noise fault, a fault in the communications line and a fault in a terminating line as determined by the control device.

6. A communications method used in a communications system disposed in a programmable logic controller (PLC), comprising:
    selecting a station number of a slave device;
    transmitting first data to the selected slave device;
    converting the transmitted first data into a first signal to determine whether the first signal is normal;
    receiving second data from the slave device;
    converting the received second data into a second signal to determine whether the received second signal is normal,
    determining whether an acknowledgement signal is normal if it is determined that the received second signal is normal,
    ending communications if it is determined that the acknowledgement signal is normal; and
    determining that there is an error and ending communications if it is determined that the acknowledgement signal is not normal.

7. The method of claim 6, further comprising:
    determining that there is an error and ending communications if it is determined that the received second signal is not normal.

* * * * *